(12) United States Patent
Jain et al.

(10) Patent No.: US 8,758,987 B2
(45) Date of Patent: Jun. 24, 2014

(54) METHODS OF FORMING A REVERSED PATTERN IN A SUBSTRATE

(75) Inventors: Kaveri Jain, Boise, ID (US); Anton J. deVilliers, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 389 days.

(21) Appl. No.: 12/552,879

(22) Filed: Sep. 2, 2009

(65) Prior Publication Data
US 2011/0052883 A1    Mar. 3, 2011

(51) Int. Cl.
*G03F 7/26*    (2006.01)

(52) U.S. Cl.
USPC ............................................. 430/322

(58) Field of Classification Search
USPC .................... 430/322, 323, 325, 326
See application file for complete search history.

(56) References Cited

U.S. PATENT DOCUMENTS

| | | | |
|---|---|---|---|
| 5,340,438 A * | 8/1994 | Roselle et al. | 216/39 |
| 6,221,562 B1 * | 4/2001 | Boyd et al. | 430/314 |
| 6,872,512 B2 | 3/2005 | Yamashita | |
| 2001/0018160 A1 * | 8/2001 | Ueda et al. | 430/190 |
| 2005/0164133 A1 * | 7/2005 | Rangarajan et al. | 430/322 |
| 2007/0009839 A1 * | 1/2007 | Harumoto | 430/313 |
| 2008/0032508 A1 | 2/2008 | Chang | |
| 2008/0199806 A1 | 8/2008 | Hatakeyama et al. | |
| 2009/0081595 A1 * | 3/2009 | Hatakeyama et al. | 430/323 |
| 2010/0040838 A1 * | 2/2010 | Abdallah et al. | 428/195.1 |

OTHER PUBLICATIONS

De Villiers, Methods of Forming Structures Supported by Semiconductor Substrates, U.S. Appl. No. 12/125,725, filed May 22, 2008.
Lee et al., Double-Patterning Technique Using Plasma Treatment of Photoresist, Japanese Journal of Applied Physics, vol. 46, No. 9B, 2007, pp. 6135-6139.
Hori et al., Sub-40nm Half-Pitch Double Patterning with Resist Freezing Process, Advances in Resist Materials and Processing Technology XXV, Proc. of SPIE, vol. 6923, 2008, pp. 69230H-1-69230H-8.

\* cited by examiner

*Primary Examiner* — Brittany Raymond
(74) *Attorney, Agent, or Firm* — TraskBritt

(57) ABSTRACT

A method of forming a reversed pattern in a substrate. A resist on a substrate is exposed and developed to form a pattern therein, the patterned resist having a first polarity. The polarity of the patterned resist is reversed to a second polarity, and a reversal film is formed over the patterned resist having the second polarity. The patterned resist having the second polarity is removed, forming a pattern in the reversal film. The pattern in the reversal film is then transferred to the substrate. Additional methods of forming a reversed pattern in a substrate are disclosed, as is a semiconductor structure formed during the methods.

17 Claims, 4 Drawing Sheets

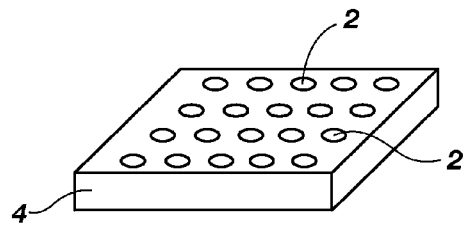
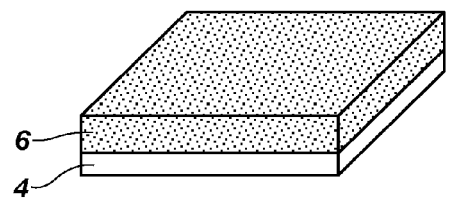
FIG. 1   FIG. 2
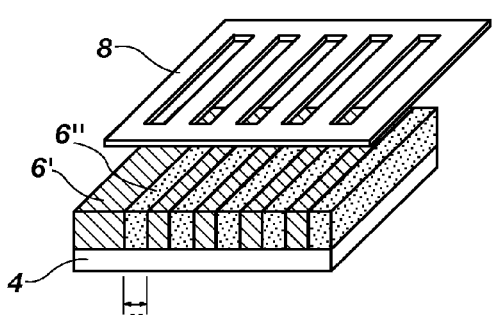
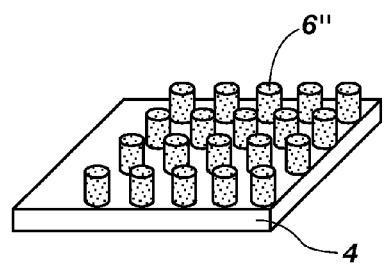
FIG. 5
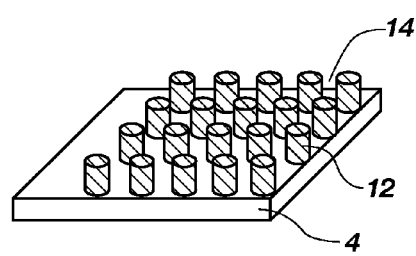
FIG. 3   FIG. 6
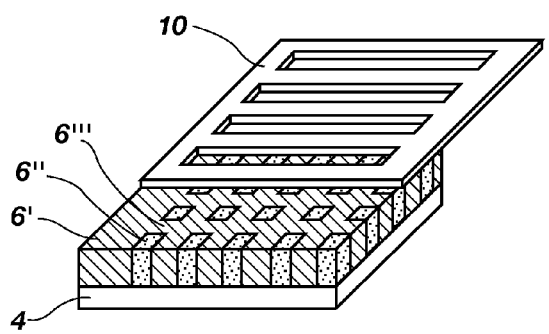
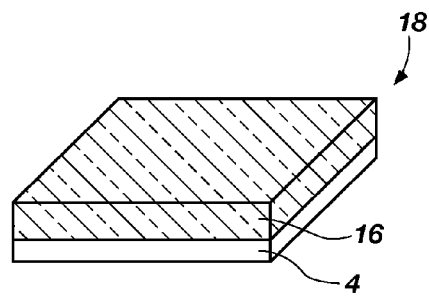
FIG. 4   FIG. 7

METHODS OF FORMING A REVERSED PATTERN IN A SUBSTRATE

TECHNICAL FIELD

The invention, in various embodiments, relates generally to a pattern reversal process. More specifically, embodiments of the invention relate to a pattern reversal process for directly patterning a substrate.

BACKGROUND

Pattern reversal processes are known in the art and are conducted by depositing a positive resist on one or more intermediate layers, which overlie a substrate. Conventionally, the intermediate layers include an underlayer and/or a hardmask. The positive resist is exposed and developed to form a positive pattern thereon. The polarity of the patterned resist is reversed using heat. A reversal film is formed over the patterned resist and subjected to an alkaline development to remove a portion of the reversal film and expose the patterned resist. The patterned resist is removed, forming a pattern in the reversal film that is the reverse of the pattern initially formed in the positive resist. The pattern in the reversal film is transferred through the intermediate layer(s) to the substrate. The reversal film is a non-photosensitive material, such as an anti-reflective coating (ARC) of an aromatic organic polymer or an organic undercoat film used in a multilayer resist (MLR) process, as described in U.S. Patent Application Publication No. 2009/0081595, now U.S. Pat. No. 8,105,764, issued Jan. 31, 2012. The reversal film is an organic film formed from a novolac resin, a polystyrene resin, a vinyl ether or acrylic resin containing anthracene or naphthalene rings, or a multi-branched resin. Such reversal films are commercially available, such as from Shin Etsu Chemical Co. (Tokyo, Japan). However, these reversal films are relatively expensive. In addition, the etch selectivity between these reversal films and the patterned resist is low, which decreases the fidelity of the pattern formed in the reversal film and transferred to the substrate. These reversal films are also typically applied as a thin coating, which further decreases the fidelity of the pattern formed in the reversal film.

BRIEF DESCRIPTION OF THE SEVERAL VIEWS OF THE DRAWINGS

FIGS. 1-7, 9, and 11 are schematic representations of a process flow, according to an embodiment of the invention, for directly patterning a substrate;

DETAILED DESCRIPTION

Figure 8:
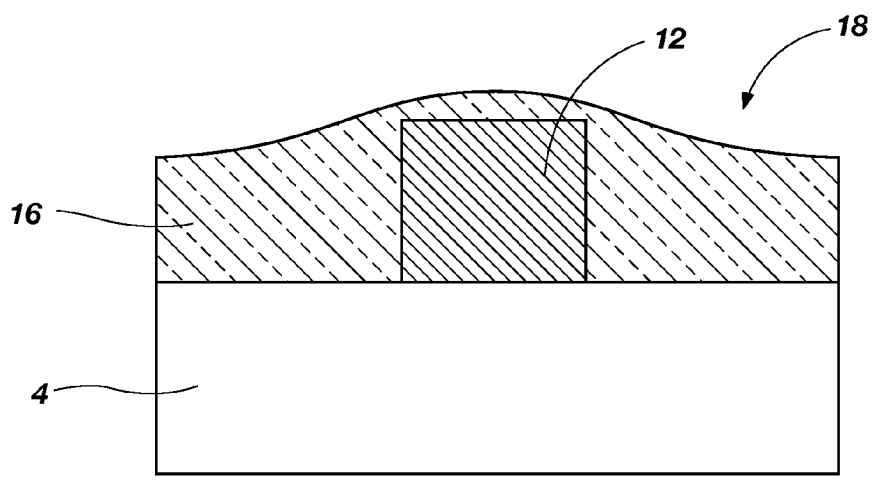
FIGS. 8, 10, 12, and 13 are schematic cross-sectional representations of a process flow, according to an embodiment of the invention, for directly patterning a substrate.

Use of a reversal film to directly pattern a substrate is disclosed. The substrate is directly patterned in that no intermediate layers are present between the substrate and the reversal film. Consequently, the substrate may be patterned using a single photolithography and etch act. The reversal film is used as a shield during patterning of the substrate. The reversal film may be used to form a reversed pattern in the substrate, the reversed pattern having dimensions that are smaller than the dimensions currently obtainable using photolithographic techniques. Since no intermediate layers are present between the substrate and the reversal film, using the reversal film eliminates materials and process acts that are required in conventional process flows, reducing the complexity and cost of the process flow.

The following description provides specific details, such as material types, material thicknesses, and processing conditions in order to provide a thorough description of embodiments of the invention. However, a person of ordinary skill in the art would understand that the embodiments of the invention may be practiced without employing these specific details. Indeed, the embodiments of the invention may be practiced in conjunction with conventional fabrication techniques employed in the industry. In addition, the description provided below does not form a complete process flow for manufacturing a semiconductor device. The semiconductor device structures described below do not form a complete semiconductor device. Only those process steps and structures necessary to understand the embodiments of the invention are described in detail below. Additional acts to form the complete semiconductor device from the semiconductor device structures may be performed using conventional fabrication techniques.

The figures presented herein are not meant to be actual views of any particular semiconductor structure formed during the process described herein, but are merely idealized or schematic representations that are employed to describe various embodiments of the invention. The figures are not necessarily drawn to scale. Additionally, elements common between figures may retain the same numerical designation.

In one embodiment, the reversal film is used to form a pattern of contact holes 2 in a substrate 4, as shown in FIG. 1. As used herein, the term "substrate" refers to a conventional silicon substrate or other bulk substrate having a layer of semiconductor material. As used herein, the term "bulk substrate" includes not only silicon wafers, but, for example, may also include silicon-on-insulator ("SOI") substrates, silicon-on-sapphire ("SOS") substrates, epitaxial layers of silicon on a base semiconductor foundation, and other semiconductor or optoelectronics materials, such as silicon-germanium, germanium, gallium arsenide, or indium phosphide. The reversal film may be used to form a reversed image of a pattern initially formed in a resist 6 overlying the substrate 4, as shown in FIG. 2. The substrate 4 may be a semiconductor substrate.

The resist 6 may be a chemically amplified photoresist, such as a chemically amplified, positive or negative photoresist. Such positive and negative photoresists are known in the art and, therefore, are not described in detail herein. In one embodiment, the resist 6 is a chemically amplified, positive resist. While various embodiments herein describe utilizing a chemically amplified positive resist, a negative resist may be used as long as there is sufficient etch selectivity between the resist 6 and the reversal film 16 for subsequent removal of the resist 6. By way of non-limiting example, the chemically amplified, positive resist may be SXM4610F, which is available from Shin Etsu Chemical Co. (Tokyo, Japan). The resist 6 may be formed on the substrate 4 by conventional techniques, such as by coating the resist 6 onto a top surface of the substrate 4. The resist 6 may be formed at a thickness that substantially corresponds to the height or depth of holes ultimately to be formed in the reversal film 16. The resist 6 may be exposed and developed to form a two-dimensional pattern therein, as shown in FIGS. 3 and 4. The pattern in the resist 6 resulting from the exposure and development is referred to herein as a "resist pattern." While various embodiments herein are described in the context of forming a two-dimensional pattern in the resist 6, a one-dimensional pattern, such as a linear pattern, may also be formed. Following the exposure act, exposed portions of positive photoresists are soluble in a developer, while unexposed portions are insoluble in the developer. For negative photoresists, exposed portions are insoluble in the developer, while unexposed portions are soluble in the developer. The developer for positive photoresists is conventionally an aqueous alkaline solution, such as an aqueous solution of tetramethylammonium hydroxide (TMAH). The developer for negative photoresists is either an aqueous alkaline solution or an organic solvent-based solution. Since exposure and development of resist materials to form a desired pattern therein is known in the art, details of the exposure and development are not described herein.

By way of non-limiting example, the two-dimensional pattern in the resist 6 may be formed by a double dipole method that includes forming a first line pattern in a first direction on the resist 6, forming a second line pattern in a perpendicular direction on the resist 6, and development. To form the two-dimensional pattern, the resist 6 may be exposed using a first mask 8 oriented in the first direction, as shown in FIG. 3, forming exposed portions 6' and unexposed portions 6" of the resist. The resist 6 may be exposed in a second direction using a second mask 10, as shown in FIG. 4, converting a portion of the unexposed portions 6" of the resist 6 into exposed portions 6'''. The first and second masks 8, 10 may include patterns configured to produce the desired pattern in the resist 6. Fabrication of the first and second masks 8, 10 to include the desired patterns is known in the art and, therefore, is not described in detail herein. While FIGS. 3 and 4 show using first and second masks 8, 10 having patterns oriented perpendicular to one another, other masks may be used depending on the two-dimensional pattern to be formed in the resist 6.

The resist 6 may then be subjected to heat (a post-exposure bake) to crosslink the exposed portions 6', 6''' of the resist 6. The conditions, such as temperature and bake time, for the post-exposure bake are dependent on the material used as the resist 6 and may be selected by a person of ordinary skill in the art. The resist 6 may then be developed such that the exposed portions 6', 6''' of the resist 6 are removed without substantially removing the unexposed portions 6" of the resist 6, as shown in FIG. 5. The developer used to remove the exposed portions 6', 6''' of the resist 6 may be selected by a person of ordinary skill in the art based on the material used as the resist 6. By way of non-limiting example, the developer used to remove the exposed portions 6', 6''' of the resist 6 may be an aqueous solution of TMAH. The developer may include from approximately 0.1% by weight (wt %) to approximately 5 wt % of TMAH, such as from approximately 2 wt % to approximately 3 wt % TMAH.

The unexposed portions 6" of the resist 6 may be subjected to heat (i.e., a hardbake), reversing the polarity of the unexposed portions 6" of the resist 6, such as from positive to negative, as indicated in FIG. 6. The unexposed portions 6" of the resist 6 having their polarity reversed are referred to herein as pillars 12 and are separated from one another by spaces 14. The polarity reversal of the resist 6 is indicated between FIGS. 5 and 6 by use of different hatching for the unexposed portions 6" of the resist 6 and the pillars 12. The heat may cause the unexposed portions 6" of the resist 6 to at least partially crosslink such that the pillars 12 become soluble in an etchant but are substantially insoluble in, or resistant to, organic solvents. By way of non-limiting example, after the reversal, the unexposed portions 6" of the resist 6 may be insoluble in PGMEA and soluble in TMAH. The hardbake of the unexposed portions 6" of the resist 6 may be used to cause activation of an acid generator in the resist 6, such that the polarity of the unexposed portions 6" of the resist 6 reverses, i.e., from positive to negative. The conditions, such as temperature and bake time, for the hardbake are dependent on the material used as the resist 6 and may be selected by a person of ordinary skill in the art. By way of non-limiting example, the unexposed portions 6" of the resist 6 may be heated to a temperature of from approximately 180° C. to approximately 220° C. to hardbake the resist 6. The pillars 12 may have dimensions that substantially correspond to the dimensions of the contact holes 2 ultimately to be formed in the substrate 4.

The reversal film 16 may then be formed over and surrounding the pillars 12, as shown in FIGS. 7 and 8. For simplicity, only one pillar 12 is shown in FIG. 8. However, in actuality, a plurality of pillars 12 may be present on semiconductor device structure 18, which includes the substrate 4, the pillars 12, and the reversal film 16. Portions of the reversal film 16 are in direct contact with the substrate 4 while the resist 6 (in the form of pillars 12) is also in direct contact with the substrate 4 and the reversal film 16. The reversal film 16 and the pillars 12, which are formed from a resist 6, the polarity of which has been reversed as previously described, may be formed from materials that are selectively etchable relative to one another. As used herein, a material is "selectively etchable" when the material exhibits an etch rate of at least approximately two times greater than that of another material exposed to the same etch chemistry and conditions. Ideally, a selectively etchable material has an etch rate of at least approximately ten times greater than that of another material exposed to the same etch chemistry and conditions. To achieve the etch selectivity, the reversal film 16 may be formed from a material having a different solubility in the etchant than the pillars 12. By way of non-limiting example, the reversal film 16 may be less soluble in the etchant than the pillars 12. Thus, the pillars 12 may be etched relative to the reversal film 16, enabling removal of the pillars 12 without substantially removing the reversal film 16, as described in detail below.

The reversal film 16 may be formed on the substrate 4 to substantially completely fill in the spaces 14 around the pillars 12 and cover the pillars 12. The reversal film 16 may be formed by conventional techniques, such as by coating or chemical vapor deposition (CVD). The coating technique may include, but is not limited to, spin coating or blanket coating. The reversal film 16 may have a sufficient viscosity to fill in the spaces 14 around the pillars 12 without forming voids around the pillars 12. The reversal film 16 formed over and around the pillars 12 may be substantially nonconformal because its thickness over the pillars 12 differs from its thickness between the pillars 12. The thickness at which the reversal film 16 is formed may depend on the height of the pillars 12. To cover the pillars 12, the reversal film 16 may be formed at a thickness greater than or equal to the height of the pillars 12. By way of non-limiting example, the thickness of the reversal film 16 may range from approximately 300 Å to approximately 1200 Å.

The reversal film 16 may be formed from a hardmask material, a bottom anti-reflective coating (BARC) material, a top coat, a novolac resin, a 193 nm resist material, a 248 nm resist material, an I-line resist material, or other material having the desired etch selectivity relative to the pillars 12. The reversal film 16 may be formulated to be applied to the substrate 4 by spin coating. By utilizing one of the above-mentioned materials as the reversal film 16, the reversal film 16 may be less expensive than conventional reversal films, such as those available from Shin Etsu Chemical Co. In addition, the above-mentioned materials provide greater pattern fidelity than those conventional reversal films. Use of one of the above-mentioned materials may also provide increased flexibility to select the material to be used as the reversal film 16 based on the properties of the material and its intended application, rather than being limited to the specific reversal films available from, for example, Shin Etsu Chemical Co.

The hardmask material used as the reversal film 16 may be a silicon-containing, material having a concentration of silicon that differs from the silicon concentration in the substrate 4. The silicon-containing hardmask material may be a spin-on, organic material that includes silicon, such as amorphous carbon containing silicon or transparent carbon containing silicon. The silicon-containing hardmask material may include, but is not limited to, a silsesquioxane material or a silanol material. The silicon-containing hardmask material may include from approximately 17% to approximately 50% silicon, with the remainder of the silicon-containing hardmask material being an organic material. By way of non-limiting example, the reversal film 16 may be a silicon-containing hardmask material having approximately 43% silicon, such as A640 from Shin Etsu Chemical Co. The different amount of silicon in the hardmask material compared to the substrate 4 may provide etch selectivity of the reversal film 16 relative to the substrate 4. The silicon-containing hardmask material may also include silicon dioxide. The hardmask material used as the reversal film 16 may also be a titanium- or aluminum-containing hardmask material.

BARC materials may also be used as the reversal film 16. BARC materials are known in the art and may be selected by a person of ordinary skill in the art to have the desired properties, such as etch selectivity relative to the pillars 12 and viscosity, for use as the reversal film 16. The BARC material may be an organic material that is formulated to be applied on the substrate 4 by spin coating. BARC materials are less expensive than the conventional reversal films available from Shin Etsu Chemical Co. By way of non-limiting example, the reversal film 16 may be 2C6B from AZ Electronic Materials USA Corp. (Charlotte, N.C.), EB52C from AZ Electronic Materials USA Corp., or ARC29 from Brewer Science Inc. (Rolla, Mo.).

The reversal film 16 may also be a photosensitive material, such as a novolac resin, a 193 nm resist material, a 248 nm resist material, or an I-line resist material. The photosensitive material used as the reversal film 16 may be an alcohol-based resist to provide the desired etch selectivity relative to the pillars 12. The photosensitive material may be formulated to be applied on the substrate 4 by spin coating. By using a photosensitive material as the reversal film 16, additional patterning of the reversal film 16 may be conducted before removing the reversal film 16. By way of non-limiting example, the reversal film 16 may be SAIL-X190 (193 nm resist) from Shin Etsu Chemical Co., M108Y (248 nm resist) from JSR Micro Inc. (Sunnyvale, Calif.), and ZR8800 (I-line resist) from Tokyo Ohka Kogyo America Inc. (Hillsboro, Oreg.).

Figure 9:
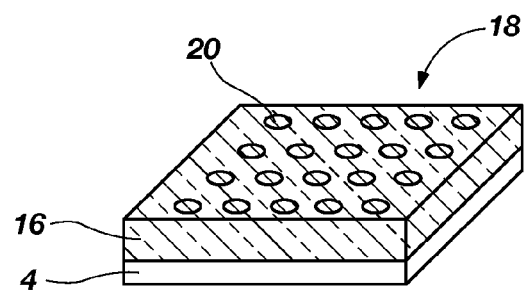
Figure 10:
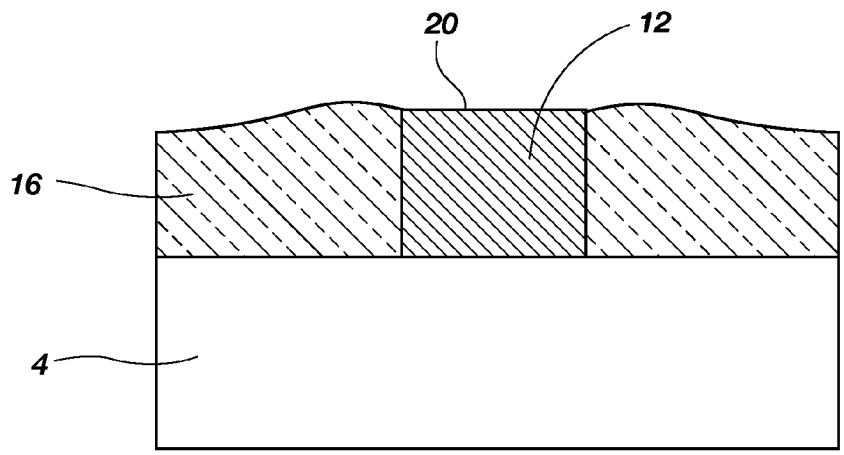
Figure 11:
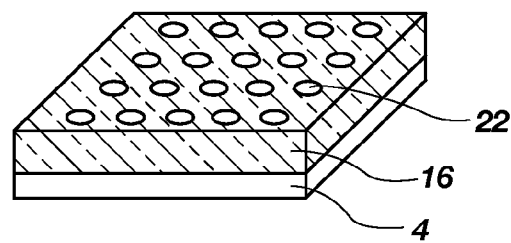
Figure 12:
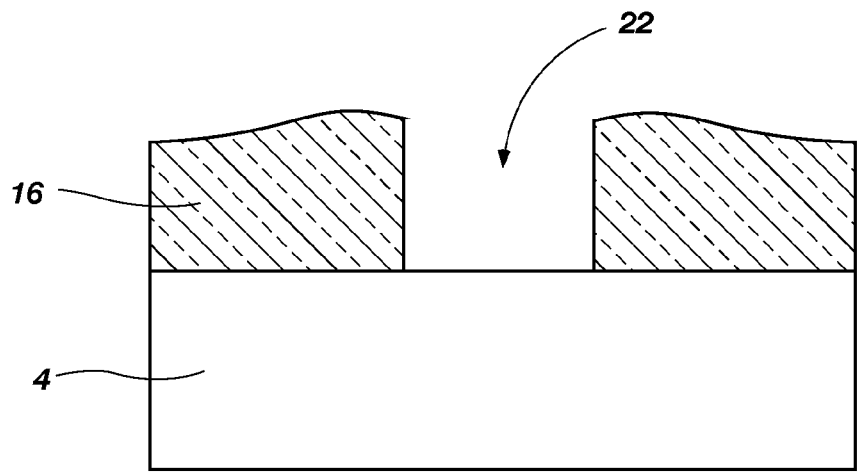

A portion of the reversal film 16 may be removed by exposing the reversal film 16 to the etchant. Since the reversal film 16 is slightly soluble in the etchant, a sufficient amount of the reversal film 16 may be removed to expose a top surface 20 of the pillars 12, as shown in FIGS. 9 and 10. Since the pillars 12 are more soluble in the etchant than the reversal film 16, the pillars 12, once exposed, may be etched at a substantially faster rate than the reversal film 16. As a result, the pillars 12 may be removed by the etchant without removing more than a surface portion of the reversal film 16, as shown in FIGS. 11 and 12. Since the dissolution rate for the reversal film 16 may be less than that of the pillars 12, the bulk of the reversal film 16 may remain on the substrate 4, while the pillars 12 are removed. The etchant may be a wet etchant or a dry etchant that is formulated to remove the surface portion of the reversal film 16 and the pillars 12. The etchant may be selected by a person of ordinary skill in the art depending on the materials used as the reversal film 16 and the pillars 12. By way of non-limiting example, if a wet etchant is used, the wet etchant may be an aqueous solution of TMAH. By way of non-limiting example, if a dry etchant is used, the dry etchant may be an oxygen plasma or $C_2H_4$ plasma.

Figure 13:
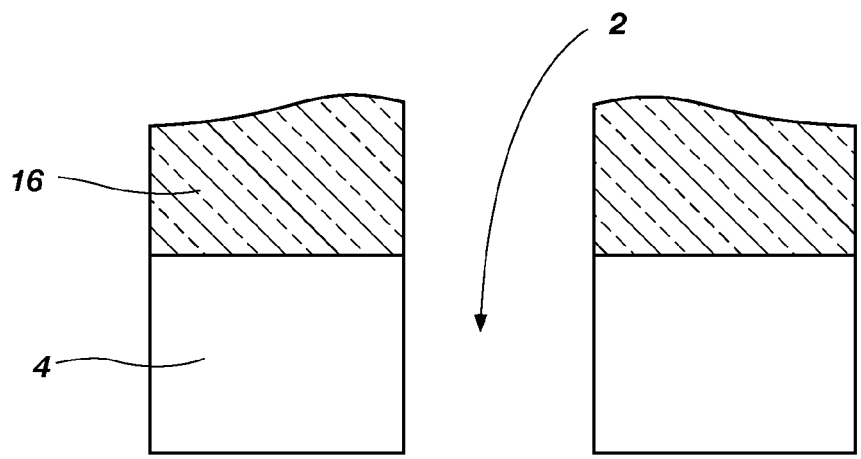

By substantially completely removing the pillars 12, a pattern of holes 22 in the reversal film 16 may be produced. The holes 22 may have dimensions that are substantially similar to the dimensions of the unexposed portions 6" of the resist 6 shown in FIG. 5. As such, the pattern of pillars 12 shown in FIG. 6 may be used to form the pattern of holes 22 shown in FIG. 11, with the pattern of holes 22 in the reversal film 16 being the reverse image of the pattern of pillars 12. The portions of the reversal film 16 remaining on the substrate 4 after removing the pillars 12 may be used as a mask to pattern the substrate 4, as shown in FIG. 13. Since the reversal film 16 is not substantially soluble in the etchant, the etch integrity and fidelity of the pattern in the reversal film 16 may be maintained, without degradation, and subsequently transferred to the substrate 4. The substrate 4 may be patterned to produce the contact holes 2, as shown in FIG. 1. However, the pattern in the reversal film 16 may also be used to form features other than contact holes 2. The substrate 4 may be etched using conventional techniques and conventional etchants, which are not described in detail herein.

After transferring the pattern to the substrate 4, the remaining portions of the reversal film 16 may be removed, producing the semiconductor device structure 18 shown in FIG. 1. The contact holes 2 in the substrate 4 may subsequently be filled with a conductive material (not shown), forming contacts. The contact holes 2 may also be filled with other materials to produce other features. While FIGS. 1-13 show the reversal of a pattern of pillars 12 of resist 6 to form a pattern of holes 22 in the reversal film 16, a similar reversal process may be used to form pillars of the reversal film from holes in the resist.

Since the reversal film 16 is in direct contact with the substrate 4 during the formation of the holes 22, the pattern of holes 22 in the reversal film 16 may be directly transferred to the substrate 4 without patterning through intermediate layers, as is required in conventional MLR processes. As such, the substrate 4 may be patterned using a single photolithography and etch act, simplifying the conventional MLR process. Conventional MLR processes utilize an underlayer and a hardmask as intermediate layers on a substrate. The hardmask is formed over and in contact with the underlayer, which is formed over and in contact with the substrate. Therefore, patterning of the substrate requires patterning the underlayer and hardmask before transferring the pattern to the substrate. In comparison, pattern transfer according to an embodiment of the invention may be accomplished with fewer deposition and etching acts because the underlayer and hardmask are not present. The reversal film 16 may replace materials, such as the underlayer and hardmask used in the conventional MLR process, which reduces the cost and complexity of the process. In addition, by forming the reversal film 16 in direct contact with the substrate 4, the profile of the contact holes 2 in the substrate 4 may be improved. By using the reversal film 16 to produce a reverse image of the unexposed portions 6" of the resist 6 (pillars 12), the contact holes 2 in the substrate 4 may have smaller dimensions than those currently obtainable by photolithographic techniques.

While the above-mentioned embodiment describes forming contact holes 2 in the substrate 4, a similar process may be used to form other patterns in the substrate 4, such as narrow trenches. The trenches formed in the substrate 4 may be the reverse image of lines formed in the resist 6. In this embodiment, the resist 6 is a chemically amplified, positive resist. Exposed portions 6' and unexposed portions 6" of the resist 6 may be formed as described above in relation to FIG. 3. The unexposed portions 6" of the resist 6 may have dimensions that are greater than or equal to the dimensions obtainable through conventional photolithography techniques. The width of the unexposed portions 6" of the resist 6 is indicated in FIG. 3 as "x." The exposed portions 6' of the resist 6 may be subjected to heat (a post-exposure bake) to crosslink the exposed portions 6'. The conditions for the post-exposure bake may be selected by a person of ordinary skill in the art based on the material used as the resist 6. The resist 6 may then be developed such that the exposed portions 6' of the resist 6 are removed without substantially removing the unexposed portions 6" of the resist 6. The developer used to remove the exposed portions 6' of the resist 6 may be selected by a person of ordinary skill in the art based on the material used as the resist 6.

Figure 14:
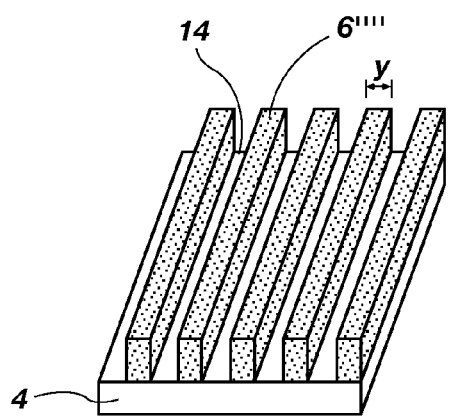
FIGS. 14-18 are schematic representations of a process flow, according to another embodiment of the invention, for directly patterning a substrate.
Figure 15:
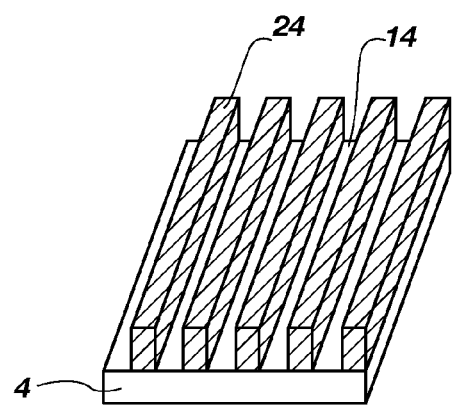
Figure 16:
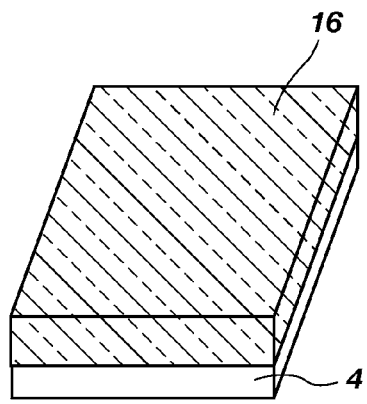
Figure 17:
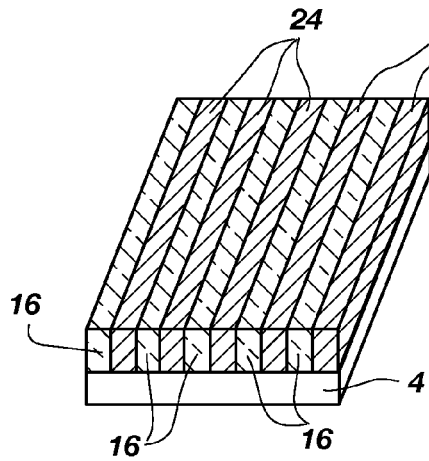

The unexposed portions 6" of the resist 6 may then be trimmed to dimensions corresponding to desired dimension of the trenches to be formed in the substrate 4, such as to dimensions below the current limit of conventional photolithography techniques, as shown in FIG. 14, where the width of the trimmed, unexposed portions 6"" of the resist 6 is indicated as "y," wherein y<x. The unexposed portions 6" of the resist 6 may be trimmed using an etchant that is formulated to etch the unexposed portions 6" while not substantially etching the underlying substrate 4. Etchants having such selectivity are known in the art and, therefore, are not described in detail herein. The trimmed, unexposed portions 6"" of the resist 6 may be subjected to heat (a hardbake), which reverses the polarity of the trimmed, unexposed portions 6"", such as from positive to negative, as indicated by the different hatching used in FIGS. 14 and 15. The trimmed, unexposed portions 6"" of the resist 6 having their polarity reversed are referred to herein as lines 24. The lines 24 may be separated from one another by spaces 14. The reversal film 16 may be applied over the lines 24, completely filling in spaces 14 between the lines 24 and covering the lines 24, as shown in FIG. 16. A portion of the reversal film 16 may be removed by exposing the reversal film 16 to the etchant as described in regard to the previous embodiment. Since the reversal film 16 is slightly soluble in the etchant, a sufficient amount of the reversal film 16 may be removed to expose a top surface of the lines 24, as shown in FIG. 17. A semiconductor device structure 18' includes alternating lines of the reversal film 16 and lines 24 on the substrate 4.

Figure 18:
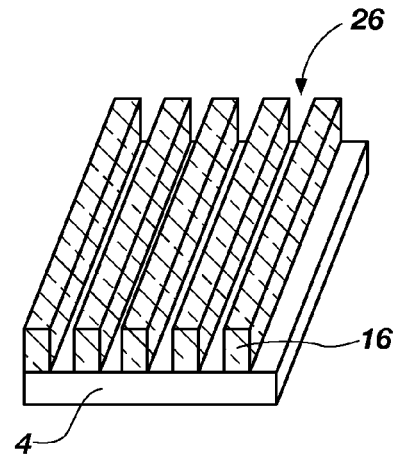

Since the lines 24 are more soluble in the etchant than the reversal film 16, the lines 24, once exposed, may be etched at a substantially faster rate than the reversal film 16. As such, the lines 24 may be removed from the substrate 4 without removing more than a surface portion of the reversal film 16, as shown in FIG. 18. By removing the lines 24, a pattern of trenches 26 in the reversal film 16 may be produced. The trenches 26 may have dimensions that are substantially similar to the dimensions of the lines 24 shown in FIG. 15. As such, the pattern of lines 24 shown in FIG. 15 may be used to form the pattern of trenches 26 shown in FIG. 18, with the pattern of trenches 26 in the reversal film 16 being the reverse image of the pattern of lines 24. The portions of the reversal film 16 remaining on the substrate 4 after removing the lines 24 may be used as a mask to pattern the substrate 4, forming trenches (not shown) in the substrate 4. The substrate 4 may be etched using conventional techniques and conventional etchants, which are not described in detail herein. Since the reversal film 16 is in direct contact with the substrate 4, the pattern of trenches 26 in the reversal film 16 may be directly transferred to the substrate 4. The trenches 26 in the substrate 4 may subsequently be filled with conventional materials (not shown) to form desired features. By using the reversal film 16 to produce a reverse image of the trimmed, unexposed portions 6"" of the resist 6, the trenches 26 in the substrate 4 may have smaller dimensions than those currently obtainable by conventional photolithographic techniques.

A method of forming a reversed pattern in a substrate is disclosed. The method includes exposing and developing a resist on a substrate to form a pattern therein. The patterned resist has a first polarity. The polarity of the patterned resist is reversed to a second polarity and a reversal film is formed over the patterned resist having the second polarity. The patterned resist having the second polarity is removed, forming a pattern in the reversal film. The pattern in the reversal film is then transferred to the substrate.

Another method of forming a reversed pattern in a substrate is disclosed. The method includes removing portions of a resist to form a patterned resist, which is in direct contact with a substrate. The patterned resist is heated to reverse a polarity thereof. A reversal film is formed over the patterned resist having the reversed polarity. A portion of the reversal film is in direct contact with the substrate. The patterned resist having the reversed polarity is removed to expose portions of the substrate, which are etched utilizing the reversal film as a mask.

A semiconductor structure is also disclosed. The semiconductor structure comprises a substrate, a portion of a reversal film directly in contact with the substrate, and a patterned resist directly in contact with the substrate.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a reversed pattern in a substrate, comprising:

exposing and developing a resist directly on a substrate to form a patterned resist having a first polarity;

reversing the first polarity of the patterned resist to a second polarity;

forming a non-conformal reversal film having a substantially non-planar exposed surface and comprising a silicon-containing hardmask material comprising amorphous carbon containing silicon or transparent carbon containing silicon directly on exposed surfaces of the substrate and the patterned resist having the second polarity;

removing the patterned resist having the second polarity using a dry etchant to form a pattern in the non-conformal reversal film; and transferring the pattern in the non-conformal reversal film to the substrate.

2. The method of claim 1, wherein exposing and developing a resist directly on a substrate to form a patterned resist having a first polarity comprises exposing and developing a positive resist directly on the substrate.

3. The method of claim 1, wherein exposing and developing a resist directly on a substrate to form a patterned resist having a first polarity and reversing the first polarity of the patterned resist to a second polarity comprises forming a pattern of resist pillars having the second polarity.

4. The method of claim 3, wherein removing the patterned resist having the second polarity using a dry etchant to form a pattern in the non-conformal reversal film comprises forming a pattern of holes in the non-conformal reversal film.

5. The method of claim 1, wherein exposing and developing a resist directly on a substrate to form a patterned resist having a first polarity and reversing the first polarity of the patterned resist to a second polarity comprises forming a pattern of resist lines having the second polarity.

6. The method of claim 5, wherein removing the patterned resist having the second polarity using a dry etchant to foam a pattern in the non-conformal reversal film comprises forming a pattern of trenches in the non-conformal reversal film.

7. The method of claim 5, further comprising trimming the pattern of resist lines.

8. The method of claim 1, wherein reversing the first polarity of the patterned resist to a second polarity comprises subjecting the patterned resist to heat.

9. The method of claim 1, wherein forming a non-conformal reversal film comprising a silicon-containing hardmask material comprising amorphous carbon containing silicon or transparent carbon containing silicon directly on exposed surfaces of the substrate and the patterned resist having the second polarity comprises depositing a material that is selectively etchable relative to the patterned resist.

10. The method of claim 1, wherein removing the patterned resist having the second polarity using a dry etchant to form a pattern in the non-conformal reversal film comprises:
    removing a surface portion of the non-conformal reversal film to expose the patterned resist having the second polarity; and
    dry etching the patterned resist having the second polarity to form holes in the non-conformal reversal film.

11. The method of claim 1, wherein forming a non-conformal reversal film comprising a silicon-containing hardmask material comprising amorphous carbon containing silicon or transparent carbon containing silicon directly on exposed surfaces of the substrate and the patterned resist having the second polarity comprises forming a material comprising from approximately 17% silicon to approximately 50% silicon directly on the exposed surfaces of the substrate and the patterned resist having the second polarity.

12. The method of claim 1, wherein removing the patterned resist having the second polarity using a dry etchant to form a pattern in the non-conformal reversal film comprises removing the patterned resist and portions of the non-conformal reversal film overlying the patterned resist using a single dry etching act.

13. The method of claim 1, wherein forming a non-conformal reversal film comprising a silicon-containing hardmask material comprising amorphous carbon containing silicon or transparent carbon containing silicon directly on exposed surfaces of the substrate and the patterned resist having the second polarity comprises forming a material comprising silicon dioxide.

14. The method of claim 1, wherein forming a non-conformal reversal film comprises forming the non-conformal reversal to comprise elevated regions and recessed regions, the elevated regions overlying the patterned resist having the second polarity, and the recessed regions between adjacent portions of the patterned resist having the second polarity.

15. A method of forming a reversed pattern in a substrate, comprising:
    reversing a polarity of a patterned resist on a substrate;
    coating a non-conformal, silicon-containing reversal film comprising amorphous carbon containing silicon or transparent carbon containing silicon on exposed surfaces of the reversed polarity patterned resist and the substrate, the non-conformal, silicon-containing reversal film having a substantially non-planar exposed surface;
    exposing the non-conformal, silicon-containing reversal film and the reversed polarity patterned resist to a single dry etchant to remove portions of the non-conformal, silicon-containing reversal film overlying the reversed polarity patterned resist and all of the reversed polarity patterned resist to form a pattern in the non-conformal, silicon-containing reversal film; and
    transferring the pattern in the non-conformal, silicon-containing reversal film to the substrate.

16. The method of claim 15, wherein exposing the non-conformal, silicon-containing reversal film and the reversed polarity patterned resist to a single dry etchant comprises exposing the non-conformal, silicon-containing reversal film and the reversed polarity patterned resist to an oxygen plasma or an acetylene plasma.

17. The method of claim 15, wherein the non-conformal, silicon-containing reversal film comprising amorphous carbon containing silicon or transparent carbon containing silicon comprises a material having a concentration of silicon differing from a concentration of silicon in the substrate.

* * * * *

UNITED STATES PATENT AND TRADEMARK OFFICE
CERTIFICATE OF CORRECTION

| | | |
|---|---|---|
| PATENT NO. | : 8,758,987 B2 | |
| APPLICATION NO. | : 12/552879 | |
| DATED | : June 24, 2014 | |
| INVENTOR(S) | : Jain et al. | |

It is certified that error appears in the above-identified patent and that said Letters Patent is hereby corrected as shown below:

In the Claims

Column 9, line 16, Claim 6, delete "foam" and insert -- form --, therefor.

Signed and Sealed this
Nineteenth Day of August, 2014

Michelle K. Lee
*Deputy Director of the United States Patent and Trademark Office*